US005894081A

United States Patent [19]
Ashuri

[11] Patent Number: 5,894,081
[45] Date of Patent: *Apr. 13, 1999

[54] METHOD AND APPARATUS FOR ADJUSTING OUTPUT SIGNALS FROM A SEMICONDUCTOR DEVICE TO FULFILL A TIMING SPECIFICATION

[75] Inventor: Roni Ashuri, Zichron Yaakov, Israel

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/616,326

[22] Filed: Mar. 15, 1996

[51] Int. Cl.$^6$ .............................. G01R 31/26; H03K 5/13
[52] U.S. Cl. .................. 73/1.42; 324/617; 324/765; 327/270
[58] Field of Search ............... 73/5, 1.42; 324/617, 324/618, 765; 327/270, 276

[56] References Cited

U.S. PATENT DOCUMENTS

| | | | |
|---|---|---|---|
| 4,157,126 | 6/1979 | Collonia | 180/176 |
| 4,627,268 | 12/1986 | Chu | 73/5 |
| 4,928,278 | 5/1990 | Otsuji et al. | 364/579 X |
| 5,086,500 | 2/1992 | Greub | 395/552 |
| 5,101,127 | 3/1992 | Simpson | 307/518 |
| 5,177,440 | 1/1993 | Walker, III et al. | 364/578 X |
| 5,225,775 | 7/1993 | Sekino | 324/158.1 |
| 5,258,951 | 11/1993 | Yu et al. | 365/189.05 |
| 5,270,643 | 12/1993 | Richardson et al. | 324/73.1 X |
| 5,274,337 | 12/1993 | Young et al. | 327/49 |
| 5,280,605 | 1/1994 | Young et al. | 395/556 |
| 5,448,193 | 9/1995 | Baumert et al. | 327/155 X |
| 5,513,152 | 4/1996 | Cabaniss | 324/617 X |
| 5,572,714 | 11/1996 | Nakakura | 395/555 |

(List continued on next page.)

FOREIGN PATENT DOCUMENTS

| | | | |
|---|---|---|---|
| 639003 | 2/1995 | European Pat. Off. | 327/276 |
| 291175 | 11/1989 | Japan | 324/618 |
| 186010 | 8/1991 | Japan | 327/276 |
| 162547 | 6/1992 | Japan | 324/617 |
| 37316 | 2/1993 | Japan | 327/270 |

OTHER PUBLICATIONS

Patent Abstracts of Europe (WO009429964A1) Dec. 12, 1994 Delmes et al. "Process for Enhancing the Noise Immunity of a Phase Locked Loop and Device for Employing Same".

*IBM Technical Disclosure Bulletin* vol. 33, No. 8, pp. 216–219, Jan. 1991 "Self–Calibrating Adjustable–Time Digital Delay" in 327/276.

Patent Abstracts of Japan Grp. p. 1388, vol. 16, No. 330 Abj Pub. Date Jul. 17, 1992 (4–98193) "Rate Adjusting Data Forming Circuit".

*IBM Technical Disclosure Bulletin* vol. 38, No. 3, pp. 85–86 Mar. 1995 "Testable Digital Delay Line" in 327/276.

Patent Abstracts of Japan (7–72214) Dated Mar. 17, 1995 "IS Testing Device".

*Primary Examiner*—Thomas P. Noland
*Attorney, Agent, or Firm*—Blakely, Sokoloff, Taylor & Zafman LLP

[57] ABSTRACT

Integrated circuits must fulfill published timing specifications that have been given to customers. To fulfill published timing specifications, such as minimum valid time and maximum valid time, a circuit for adjusting the output signals from an integrated circuit is introduced. The circuit comprises in part a speed detector circuit that determines the speed of a clock signal. The speed detector circuit outputs a speed signal that defines how fast the integrated circuit is operating. The speed signal is passed to a speed adjustment circuit. The speed adjustment circuit delays, as appropriate, output signals from the integrated circuit. The output signals are delayed such that output signals fulfill the timing, specifications published in the data book for this integrated circuit. The speed adjustment circuit delays output signals by adding buffers along the data path which add propagation delay to the output data path. A similar circuit is disclosed wherein input data is delayed such that set-up time and hold time specifications are met.

12 Claims, 4 Drawing Sheets

U.S. PATENT DOCUMENTS

| | | | |
|---|---|---|---|
| 5,592,111 | 1/1997 | Wong et al. | 327/45 |
| 5,663,688 | 9/1997 | Delmes et al. | 327/156 X |
| 5,668,491 | 9/1997 | Higashisaka et al. | 327/270 X |
| 5,675,265 | 10/1997 | Yamamori | 327/262 X |
| 5,684,423 | 11/1997 | Koyashiki et al. | 327/270 X |
| 5,712,583 | 1/1998 | Frankeny | 327/158 |

METHOD AND APPARATUS FOR ADJUSTING OUTPUT SIGNALS FROM A SEMICONDUCTOR DEVICE TO FULFILL A TIMING SPECIFICATION

FIELD OF THE INVENTION

The field of the present invention is semiconductor devices. Specifically, the invention relates to a circuit for adjusting the output signals of a semiconductor device to fulfill a set of timing specifications for the semiconductor device.

BACKGROUND OF THE INVENTION

When an integrated circuit is marketed, a data sheet for the integrated circuit is usually produced for distribution to electrical engineers that may incorporate the integrated circuit into products that they are designing. Several data sheets are gathered together to form a data book that is published by the integrated circuit company. These data books describe the integrated circuits produced by the integrated circuit producer.

The data sheet about the integrated circuit contains a large number of specifications that define the exact behavior of the integrated circuit. For example, operating temperature, operating voltages, and several timing specifications are provided on the data sheet. Two of the timing specifications that are often provided the minimum valid time for an output signal and the maximum valid time for an output signal. A minimum valid time defines the minimum amount of time that the output signal must be available on the output line after a clock cycle has started. The output signal must not change before this minimum valid time has expired. The maximum valid time defines a maximum amount of time that may pass after a clock cycle has started before which the output data signal must be stable. Thus, the output signal must be stable before the maximum valid time ends.

During the market lifetime for an integrated circuit, the process technology used to build the integrated circuit may change several times. Furthermore, the integrated circuit may be redesigned in the inside to make it more efficient, adapt to new process technologies, and to use less power. These design changes may change the speed at which the integrated circuit operates. However, unless the integrated circuit device is introduced as a new modified integrated circuit, the integrated circuit must still fulfill the timing requirements of the original integrated circuit as published in the data page in a data book. Therefore, it would be desirable to have a method and apparatus for adjusting the output signals of a modified integrated circuit such that it fulfills the timing requirements of the original integrated circuit that are published in the data book.

SUMMARY OF THE INVENTION

A method and apparatus for adjusting the output signals from an integrated circuit to fulfill published timing specifications is disclosed. The apparatus comprises in part a speed detector circuit that determines the speed of the integrated circuit. The speed detector circuit outputs a speed signal that defines how fast the clock is operating. The speed signal is passed to a speed adjustment circuit. The speed adjustment circuit delays, as appropriate, output signals from the integrated circuit. The output signals are delayed such that output signals fulfill the timing specifications published in the data book for this integrated circuit. The speed adjustment circuit delays output signals by adding buffers along the data path which add propagation delay to the output data path.

DETAILED DESCRIPTION OF THE PRESENT INVENTION

A method and apparatus for output signals from a semiconductor device to fulfill a timing specification is disclosed. In the following description, for purposes of explanation, specific nomenclature is set forth to provide a thorough understanding of the present invention. However, it will be apparent to one skilled in the art that these specific details are not required in order to practice the present invention.

Figure 1:
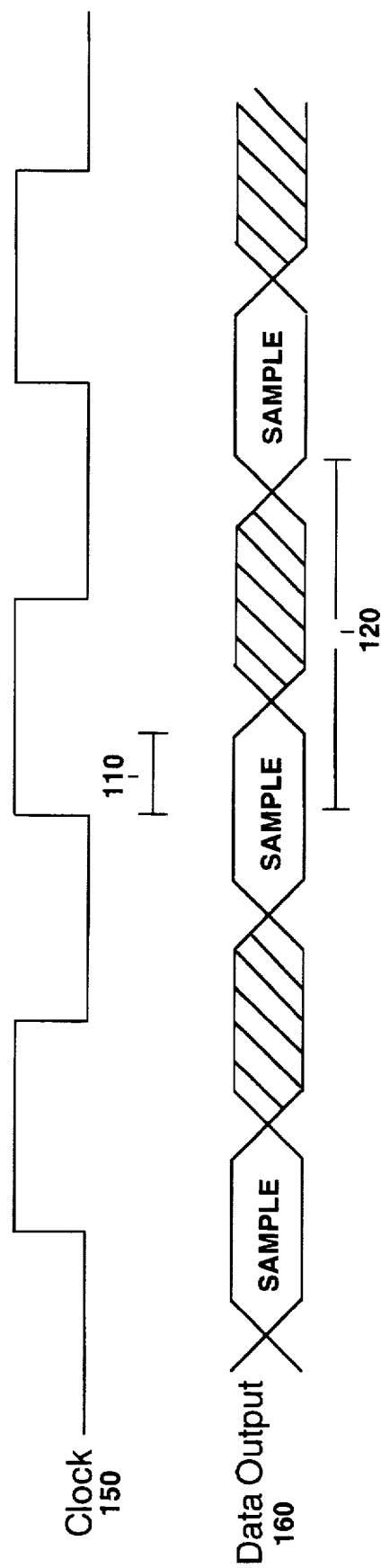
FIG. 1 illustrates a timing diagram of an output signal for an integrated circuit.

FIG. 1 illustrates a clock signal 150 for driving an integrated circuit and an output data signal 160 from integrated circuit. The clock signal 150 is used to drive the internal circuitry within the integrated circuit. Output signal 160 is the output from an integrated circuit. During each clock cycle, the output data signal has a certain period that is referred to as the sample period. The sample period refers to when the data output signal may be sampled by an outside source.

Two important timing specifications that define the output characteristics of the data output data signal 160 are the minimum valid time and the maximum valid time. These two timing specifications are illustrated on FIG. 1. At the beginning of each clock cycle, a valid output data signal 160 is available for sampling on the data output line. A minimum valid time period 110 defines the minimum amount of time that the output data signal 160 must be valid after the beginning of the clock cycle. The maximum valid time 120 defines the maximum amount of time until the next output data signal 160 will be available on the data output line. This time is measured from beginning of the clock cycle.

These minimum and maximum valid times are usually published on a data sheet about the integrated circuit. However, during the integrated circuits lifetime several new process technologies may be used to implement the integrated circuit. The new process technologies may cause the timing properties of the integrated circuit to change. Furthermore, the propagation delay within an integrated circuit may vary due to the amount of voltage applied to the integrated circuit, the operating temperature, electrical noise, and other factors. To keep the output signal of an integrated circuit within the published minimum valid time and maximum minimum valid time, the present invention introduces a self controlled delay circuit that is placed just before the output buffer on a data output line.

Figure 2:
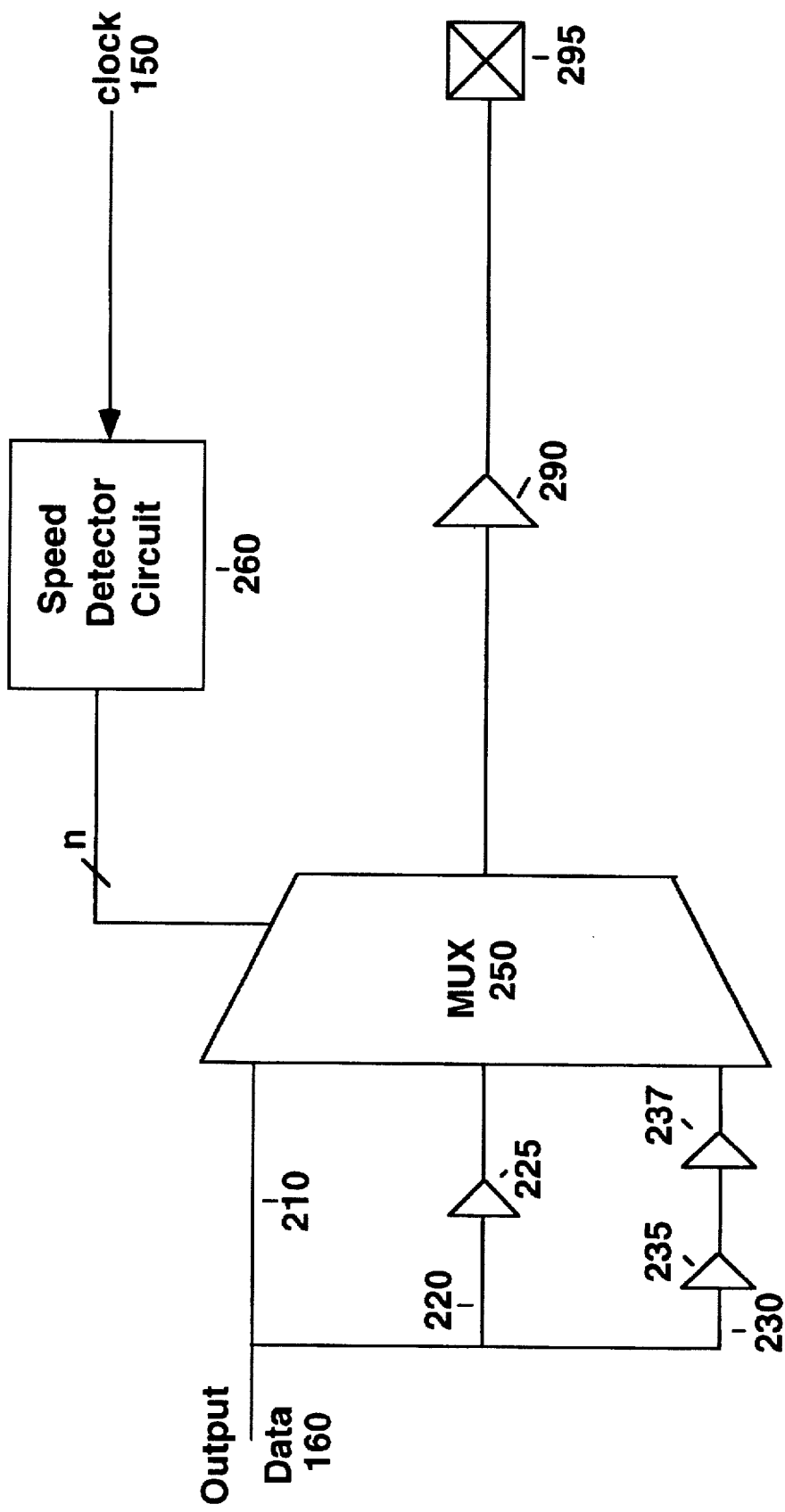
FIG. 2 illustrates a delay circuit of a present invention for adjusting the timing of output data signals.

FIG. 2 illustrates one embodiment of the output circuit of the present invention. A speed detector circuit 260 measures a speed of the integrated circuit by testing the clock signal applied to the integrated circuit. The speed detector circuit 260 also takes into account other parameters that affect the speed of the integrated circuit such as the process technology used to build the present implementation of the integrated circuit, the operating temperature, and the operating voltage. The speed detector circuit 260 outputs an encoded value on a set of n lines that describes the speed of the present implementation of the integrated circuit. In the embodiment of FIG. 2, the speed detector circuit 260 designates the integrated circuit as operating slow, medium or fast. However, any number of different speed levels may be specified.

The speed code from speed detector circuit 260 controls a multiplexer 250. The input of the multiplexor 250 is the output data 160 desired to be sent out of the integrated circuit after it has traveled through one of the different paths that enter multiplexor 250. Specifically, the different paths that enter multiplexor 250 each have different propagation delays. In the embodiment of FIG. 2 there is an unmodified (no delay) integrated circuit path 210, a medium delay integrated circuit path 220 and a long delay integrated circuit path 230. If the integrated circuit is determined to be a slow version of the integrated circuit the output data passes along unmodified circuit path 210 through the multiplexer to the output buffer 290 and to the output pad 295.

However, if this is a faster implementation of the integrated circuit the output data needs to be delayed slightly. Thus if this is a faster speed implementation of the integrated circuit, the output data 160 will pass through medium delay integrated circuit path 220 which has a single output buffer 225. The output buffer 225 on the medium delay integrated circuit path 220 introduces a small amount of propagation delay to the output signal before it passes through multiplexer 250 and output buffer 290 to the output pad 295. The propagation delay introduced by output buffer 225 ensures that a faster integrated circuit will have its output data delayed such that the valid sample time of the output data on the pad 295 will not be less then the minimum valid time as defined by the data sheet for the integrated circuit.

If the integrated circuit is a very fast implementation, then the output data 160 will pass through the long delay integrated circuit path 230. Long delay integrated circuit path 230 has two buffers 235 and 237. Buffers 235 and 237 introduce a substantial amount of propagation delay to the output data signal before if passes through multiplexer 250 and output buffer 290 to the output pad 295 such that the output signal will meet the minimum valid time and maximum valid time specifications as defined by the data sheet for the integrated circuit.

The circuit of the present invention can easily be expanded. For example, additional delay paths with 3, 4, or 5 buffers in series can be added if such long delays are required to fulfill the timing specifications.

Figure 3:
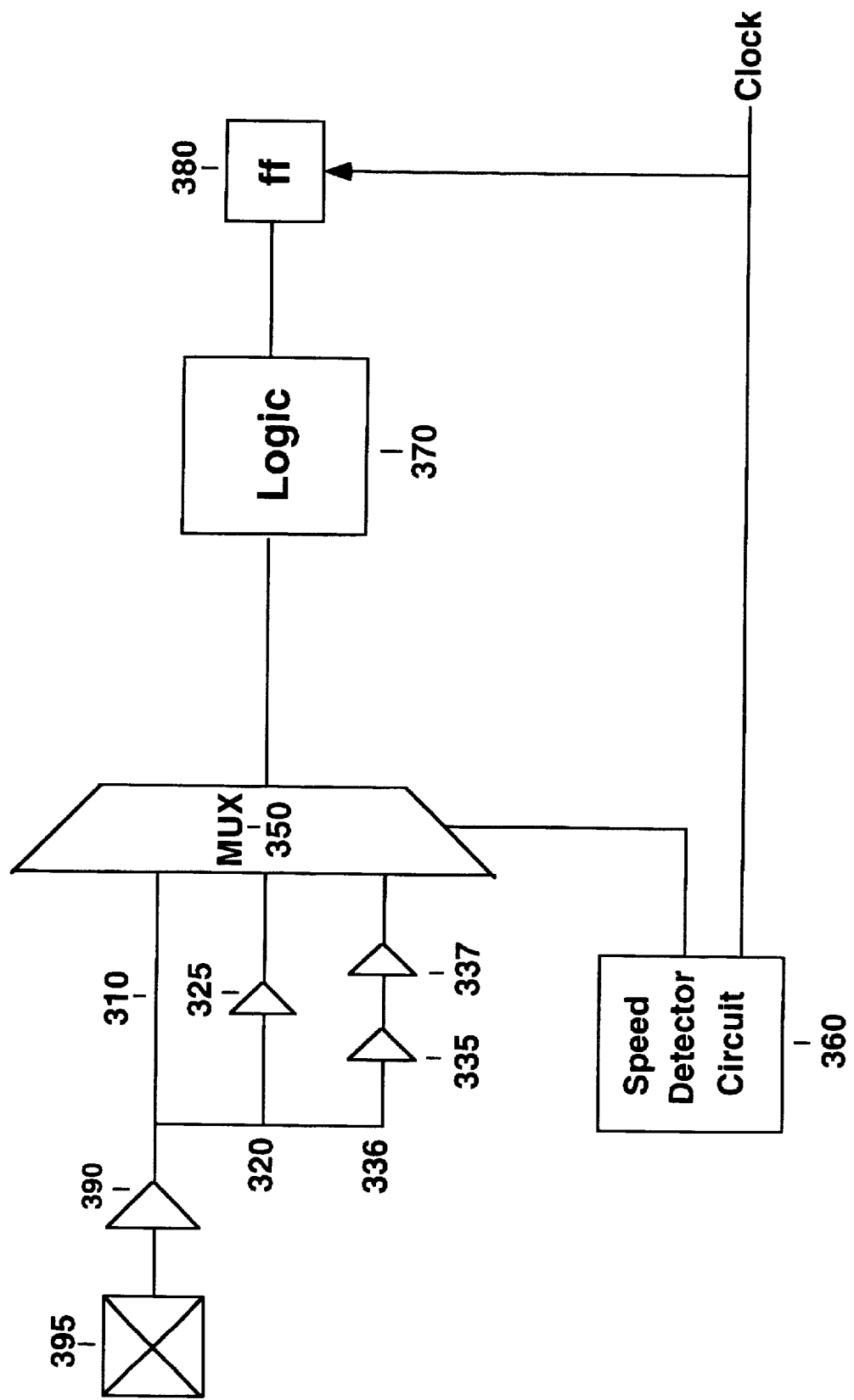
FIG. 3 illustrates a delay circuit of a present invention for adjusting the timing of input data signals.

A circuit of the present invention can also be used to delay input signals. FIG. 3 illustrates an embodiment of the present invention when a clock is coupled to a speed detector circuit 360 that controls a multiplexor 350 that is coupled to three different input paths. The incoming delay circuit of FIG. 3 can be used in applications where the integrated circuits is being placed in an environment faster than it is designed for.

Input signals are often defined by a set-up time and a hold time. The set-up time defines the minimum time required to set a signal to its final value. A signal should not be sampled until the set-up time has passed. The hold time defines a minimum period of time that a signal is held steady for sampling. A signal should be sampled during the hold time. In a fast environment, the set-up time will be reduced, however, the hold time might also be reduced. Thus to position the hold time to match the sampling time, the input signal can be delayed by the circuit of the present invention.

The speed detector circuit 360 determines the speed of incoming clock and the speed of the current implementation of the integrated circuit. If necessary, the speed detector circuit 360 can instruct the multiplexer 350 to delay the incoming input signal by putting it through medium delay path 320 or long delay path 336 such that a propagation delay is introduced on the input signal. This will enable the input signal to remain valid at the proper time such that the integrated circuit may sample the incoming circuit after is has passed through logic 370.

To prevent the delay circuit of FIG. 2 and FIG. 3 from oscillating between different speed levels, the speed detector circuit should be built with an amount of hysteresis. For example, if the speed of speed detector circuit 260 of FIG. 2 has no hysteresis, then a clock speed just on the border defining the difference between a "slow" speed integrated circuit from a "medium" speed integrated circuit might cause the speed detector circuit 260 to oscillate between "slow" and "medium" speed. This may cause undesired effects. Instead, hysteresis should be added to the speed detector circuit 260.

Figure 4:
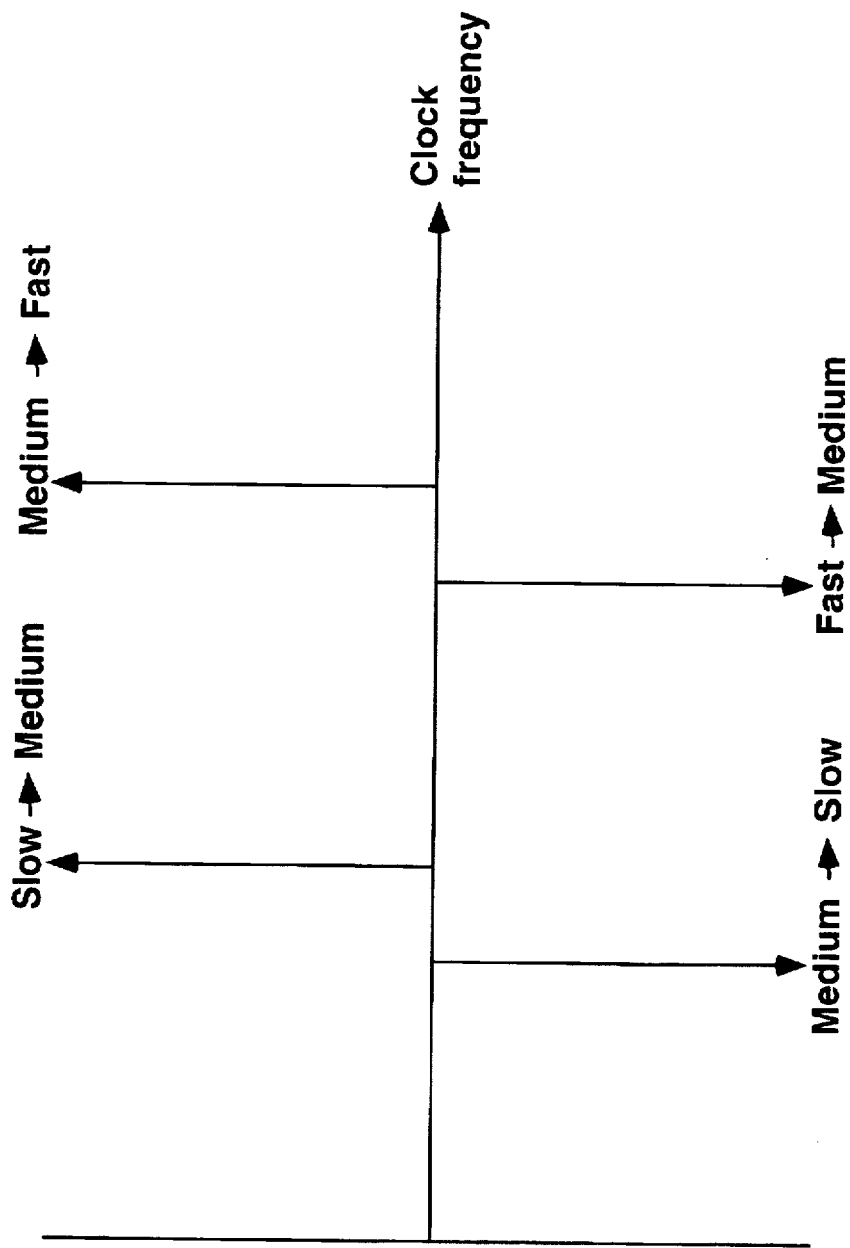
FIG. 4 illustrates a conceptual diagram that illustrates how hysteresis can be introduced.

FIG. 4 illustrates chart that conceptually describes how the state transitions should occur in the speed detector circuit 260 of FIG. 2. Specifically, the integrated circuit speed at which a transition from "slow" to "medium" speed occurs should be faster than the speed at which "medium" to "slow" transition occurs. Similarly, the integrated circuit speed at which a transition from "medium" to "fast" speed occurs should be faster than the speed at which "fast" to "medium" transition occurs.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. An circuit for adjusting a data output signal from an integrated circuit, said circuit comprising:

a clock signal, said clock signal driving said integrated circuit;

a speed detector circuit on said integrated circuit, said speed detector circuit receiving said clock signal, said speed detector circuit determining a relative frequency of said clock signal to generate a speed signal; and a delay circuit, said delay circuit selectively delaying said data output signal based upon said speed signal to meet at least one defined timing parameter for said data output signal.

2. The circuit of claim 1 wherein said delay circuit comprises a multiplexor controlling more than one data signal path wherein each data signal path has a different amount of propagation delay.

3. The circuit of claim 2 wherein said different amounts of propagation delay are created by adding buffers to said data signal paths.

4. The circuit of claim 1 wherein said defined timing parameter comprises a minimum valid time.

5. The circuit of claim 1 wherein said defined timing parameter comprises a maximum valid time.

6. A method for adjusting a data output signal from an integrated circuit to fulfill a defined timing specification, said method comprising the steps of:

determining a speed of said integrated circuit using a speed detector circuit on said integrated circuit, said speed detector circuit determining a relative frequency of an input clock signal; and selectively delaying said data output signal based upon said speed of said integrated circuit to meet at least one defined timing parameter for said data output signal.

7. The method of claim 6 wherein said step of selectively delaying said data output signal comprises controlling a multiplexor that selects one output data path out of more than one data paths wherein each data path has a different amount of propagation delay.

8. The method of claim 6 wherein said step of determining a speed of said integrated circuit further comprises determining an operating voltage of said integrated circuit.

9. The method of claim 6 wherein said defined timing parameter comprises a minimum valid time.

10. The method of claim 6 wherein said defined timing parameter comprises a maximum valid time.

11. The method of claim 6 wherein selectively delaying said data output signal comprises controlling a multiplexor that selects a first data signal path from a set of data signal paths wherein each data signal path in said set of data signal paths has a different amount of propagation delay.

12. The method of claim 11 wherein said different amounts of propagation delay are created by adding buffers to said data signal paths.

* * * * *